United States Patent
Chang Chien et al.

(10) Patent No.: US 8,124,447 B2
(45) Date of Patent: Feb. 28, 2012

(54) MANUFACTURING METHOD OF ADVANCED QUAD FLAT NON-LEADED PACKAGE

(75) Inventors: Pao-Huei Chang Chien, Kaohsiung County (TW); Ping-Cheng Hu, Kaohsiung (TW); Po-Shing Chiang, Kaohsiung County (TW); Wei-Lun Cheng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 224 days.

(21) Appl. No.: 12/547,787

(22) Filed: Aug. 26, 2009

(65) Prior Publication Data

US 2010/0258920 A1 Oct. 14, 2010

Related U.S. Application Data

(60) Provisional application No. 61/168,220, filed on Apr. 10, 2009.

(51) Int. Cl.
*H01L 21/00* (2006.01)

(52) U.S. Cl. .. 438/106; 438/123; 438/124; 257/E21.502

(58) Field of Classification Search .................. 257/666, 257/676, E23.031, E23.052, E21.502, E21.505; 438/106, 123, 124
See application file for complete search history.

(56) References Cited

U.S. PATENT DOCUMENTS

| | | |
|---|---|---|
| 4,948,032 A | 8/1990 | Dunaway et al. |
| 5,200,025 A | 4/1993 | Toei et al. |
| 5,389,739 A | 2/1995 | Mills |
| 5,800,958 A | 9/1998 | Manteghi |
| 5,804,468 A | 9/1998 | Tsuji et al. |
| 5,847,458 A | 12/1998 | Nakamura et al. |
| 5,900,676 A | 5/1999 | Kweon et al. |
| 5,969,412 A | 10/1999 | Matsutomo |
| 6,001,671 A | 12/1999 | Fjelstad |
| 6,025,650 A | 2/2000 | Tsuji et al. |
| 6,093,584 A | 7/2000 | Fjelstad |
| 6,097,098 A | 8/2000 | Ball |
| 6,132,593 A * | 10/2000 | Tan ..................... 205/776.5 |
| 6,201,292 B1 | 3/2001 | Yagi et al. |
| 6,238,952 B1 | 5/2001 | Lin |
| 6,242,284 B1 | 6/2001 | Kang et al. |
| 6,261,864 B1 | 7/2001 | Jung et al. |
| 6,291,271 B1 | 9/2001 | Lee et al. |

(Continued)

FOREIGN PATENT DOCUMENTS

CN 1726591 1/1996

(Continued)

OTHER PUBLICATIONS

Chien et al., U.S. Appl. No. 12/192,702, filed Aug. 15, 2008 for "Advanced Quad Flat No Lead Chip Package Having a Cavity Structure and Manufacturing Methods Thereof." Office Actions mailed Nov. 17, 2010; Mar. 31, 2011.

(Continued)

*Primary Examiner* — Tuan N. Quach

(74) *Attorney, Agent, or Firm* — Cooley LLP

(57) ABSTRACT

The manufacturing method of advanced quad flat non-leaded packages includes performing a pre-cutting process prior to the backside etching process for defining the contact terminals. The pre-cutting process ensures the isolation of individual contact terminals and improves the package reliability.

29 Claims, 8 Drawing Sheets

U.S. PATENT DOCUMENTS

| | | | |
|---|---|---|---|
| 6,303,985 B1 | 10/2001 | Larson et al. | |
| 6,306,685 B1 | 10/2001 | Liu et al. | |
| 6,333,252 B1 | 12/2001 | Jung et al. | |
| 6,342,730 B1 | 1/2002 | Jung et al. | |
| 6,379,996 B1 | 4/2002 | Suzuki | |
| 6,410,987 B1 | 6/2002 | Kanemoto et al. | |
| 6,424,047 B1 | 7/2002 | Chua et al. | |
| 6,429,536 B1 | 8/2002 | Liu et al. | |
| 6,451,627 B1 | 9/2002 | Coffman | |
| 6,495,909 B2 | 12/2002 | Jung et al. | |
| 6,498,099 B1 | 12/2002 | McLellan et al. | |
| 6,501,162 B2 | 12/2002 | Sakamoto et al. | |
| 6,525,406 B1 | 2/2003 | Chung et al. | |
| 6,528,877 B2 | 3/2003 | Ernst et al. | |
| 6,528,879 B2 | 3/2003 | Sakamoto et al. | |
| 6,528,893 B2 | 3/2003 | Jung et al. | |
| 6,545,347 B2 | 4/2003 | McClellan | |
| 6,548,328 B1 | 4/2003 | Sakamoto et al. | |
| 6,551,859 B1 | 4/2003 | Lee et al. | |
| 6,562,660 B1 | 5/2003 | Sakamoto et al. | |
| 6,585,905 B1 | 7/2003 | Fan et al. | |
| 6,586,677 B2 | 7/2003 | Glenn | |
| 6,635,956 B2 | 10/2003 | Sakamoto et al. | |
| 6,635,957 B2 | 10/2003 | Kwan et al. | |
| 6,683,368 B1 | 1/2004 | Mostafazadeh | |
| 6,689,640 B1 | 2/2004 | Mostafazadeh | |
| 6,700,188 B2 | 3/2004 | Lin | |
| 6,706,547 B2 | 3/2004 | Sakamoto et al. | |
| 6,713,849 B2 | 3/2004 | Hasebe et al. | |
| 6,740,961 B1 | 5/2004 | Mostafazadeh | |
| 6,759,271 B2 | 7/2004 | Miyazaki | |
| 6,777,788 B1 | 8/2004 | Wan et al. | |
| 6,812,063 B2 | 11/2004 | Huang | |
| 6,812,410 B2 | 11/2004 | Sakamoto et al. | |
| 6,812,552 B2 | 11/2004 | Islam et al. | |
| 6,818,973 B1 | 11/2004 | Foster | |
| 6,861,295 B2 | 3/2005 | Jung et al. | |
| 6,861,734 B2 | 3/2005 | Minamio et al. | |
| 6,906,414 B2 | 6/2005 | Zhao et al. | |
| 6,927,483 B1 | 8/2005 | Lee et al. | |
| 6,933,594 B2 | 8/2005 | McLellan et al. | |
| 6,946,324 B1 | 9/2005 | McLellan et al. | |
| 6,949,816 B2 | 9/2005 | Brown et al. | |
| 6,975,022 B2 | 12/2005 | Sakamoto et al. | |
| 6,975,038 B1 | 12/2005 | Mostafazadeh | |
| 6,984,880 B2 | 1/2006 | Minamio et al. | |
| 6,995,459 B2 | 2/2006 | Lee et al. | |
| 6,995,460 B1 | 2/2006 | McLellan et al. | |
| 7,026,190 B2 | 4/2006 | Kobayashi et al. | |
| 7,049,177 B1 | 5/2006 | Fan et al. | |
| 7,060,535 B1 | 6/2006 | Sirinorakul et al. | |
| 7,091,606 B2 | 8/2006 | Sakamoto et al. | |
| 7,095,100 B2 | 8/2006 | Kasuya | |
| 7,125,798 B2 | 10/2006 | Sakamoto et al. | |
| 7,129,116 B2 | 10/2006 | Islam et al. | |
| 7,145,222 B2 | 12/2006 | Gai | |
| 7,166,495 B2 | 1/2007 | Ball | |
| 7,173,336 B2 | 2/2007 | Sakamoto et al. | |
| 7,193,302 B2 | 3/2007 | Tseng | |
| 7,196,416 B2 | 3/2007 | Hochstenbach et al. | |
| 7,208,826 B2 | 4/2007 | Sakamoto et al. | |
| 7,215,009 B1 | 5/2007 | Leng et al. | |
| 7,226,811 B1 | 6/2007 | McLellan et al. | |
| 7,235,888 B2 | 6/2007 | Hosokawa et al. | |
| 7,247,526 B1 | 7/2007 | Fan et al. | |
| 7,247,938 B2 | 7/2007 | Groenhuis et al. | |
| 7,262,491 B2 | 8/2007 | Islam et al. | |
| 7,271,032 B1 | 9/2007 | McLellan et al. | |
| 7,301,225 B2 | 11/2007 | Wong et al. | |
| 7,319,266 B2 | 1/2008 | St. Germain et al. | |
| 7,344,920 B1 | 3/2008 | Kirloskar et al. | |
| 7,348,663 B1 | 3/2008 | Kirloskar et al. | |
| 7,351,612 B2 | 4/2008 | Gai | |
| 7,382,044 B1 | 6/2008 | Yilmaz et al. | |
| 7,407,834 B2 | 8/2008 | Shimanuki et al. | |
| 7,410,834 B2 | 8/2008 | Fukaya et al. | |
| 7,443,012 B2 | 10/2008 | Yamaguchi | |
| 7,446,397 B2 | 11/2008 | Gai | |
| 7,459,347 B2 | 12/2008 | Shimanuki et al. | |
| 7,494,557 B1 * | 2/2009 | Peterson | 156/89.11 |
| 7,518,156 B2 | 4/2009 | Hasebe et al. | |
| 7,545,026 B2 | 6/2009 | Six | |
| 7,550,322 B2 | 6/2009 | Kimura | |
| 7,563,648 B2 | 7/2009 | Islam et al. | |
| 7,598,606 B2 | 10/2009 | Chow et al. | |
| 7,608,482 B1 | 10/2009 | Bayan | |
| 7,622,332 B2 | 11/2009 | Islam et al. | |
| 7,679,172 B2 | 3/2010 | Huang et al. | |
| 7,683,461 B2 | 3/2010 | Lau | |
| 7,786,557 B2 | 8/2010 | Hsieh et al. | |
| 7,790,500 B2 | 9/2010 | Ramos et al. | |
| 7,799,611 B2 | 9/2010 | Ramos et al. | |
| 7,834,431 B2 | 11/2010 | Hooper et al. | |
| 7,834,469 B2 | 11/2010 | Chuang et al. | |
| 7,838,974 B2 | 11/2010 | Poddar et al. | |
| 7,846,775 B1 | 12/2010 | Lee et al. | |
| 2001/0052600 A1 | 12/2001 | Sakamoto et al. | |
| 2002/0084518 A1 | 7/2002 | Hasebe et al. | |
| 2002/0096790 A1 | 7/2002 | Kasuya | |
| 2002/0109214 A1 | 8/2002 | Minamio et al. | |
| 2002/0160552 A1 | 10/2002 | Minamio et al. | |
| 2002/0163015 A1 | 11/2002 | Lee et al. | |
| 2003/0071333 A1 | 4/2003 | Matsuzawa | |
| 2003/0092205 A1 | 5/2003 | Wu et al. | |
| 2003/0127711 A1 | 7/2003 | Kawai et al. | |
| 2003/0170922 A1 | 9/2003 | Sakamoto et al. | |
| 2004/0046237 A1 | 3/2004 | Abe et al. | |
| 2004/0094829 A1 | 5/2004 | Minamio et al. | |
| 2004/0124505 A1 | 7/2004 | Mahle et al. | |
| 2004/0217450 A1 | 11/2004 | Li et al. | |
| 2004/0262718 A1 | 12/2004 | Ramakrishna | |
| 2005/0023667 A1 | 2/2005 | Lin et al. | |
| 2005/0146058 A1 | 7/2005 | Danno | |
| 2006/0033184 A1 | 2/2006 | Park et al. | |
| 2006/0055009 A1 | 3/2006 | Shim et al. | |
| 2006/0240600 A1 | 10/2006 | Ito et al. | |
| 2007/0018291 A1 | 1/2007 | Huang et al. | |
| 2007/0052076 A1 | 3/2007 | Ramos et al. | |
| 2007/0059863 A1 | 3/2007 | Li et al. | |
| 2007/0075404 A1 | 4/2007 | Dimaano et al. | |
| 2007/0085199 A1 | 4/2007 | Ong et al. | |
| 2007/0141756 A1 * | 6/2007 | Iitani et al. | 438/123 |
| 2007/0164403 A1 | 7/2007 | Huang et al. | |
| 2007/0164411 A1 | 7/2007 | Huang et al. | |
| 2007/0181983 A1 | 8/2007 | Takai et al. | |
| 2007/0194417 A1 | 8/2007 | Yoshida et al. | |
| 2007/0222040 A1 | 9/2007 | Lin | |
| 2008/0029855 A1 | 2/2008 | Chang | |
| 2008/0029856 A1 | 2/2008 | Chou et al. | |
| 2008/0061414 A1 | 3/2008 | Retuta et al. | |
| 2008/0067649 A1 | 3/2008 | Matsunaga et al. | |
| 2008/0079124 A1 | 4/2008 | Haga et al. | |
| 2008/0079127 A1 | 4/2008 | Gerber | |
| 2008/0093715 A1 | 4/2008 | Lange et al. | |
| 2008/0102563 A1 | 5/2008 | Lange et al. | |
| 2008/0179758 A1 | 7/2008 | Wong et al. | |
| 2008/0191325 A1 | 8/2008 | Shirasaka | |
| 2008/0258278 A1 | 10/2008 | Ramos et al. | |
| 2008/0258279 A1 | 10/2008 | Lin et al. | |
| 2008/0311705 A1 | 12/2008 | Kim | |
| 2009/0001540 A1 | 1/2009 | Yang et al. | |
| 2009/0065914 A1 | 3/2009 | Engl | |
| 2009/0189260 A1 | 7/2009 | Hasebe et al. | |
| 2009/0189261 A1 | 7/2009 | Lim et al. | |
| 2009/0230523 A1 | 9/2009 | Chien et al. | |
| 2009/0230524 A1 | 9/2009 | Chien et al. | |
| 2009/0230525 A1 | 9/2009 | Chien et al. | |
| 2009/0230526 A1 | 9/2009 | Chen et al. | |
| 2009/0267210 A1 | 10/2009 | Chuang | |
| 2009/0278243 A1 | 11/2009 | Chuang | |
| 2009/0283882 A1 * | 11/2009 | Hsieh et al. | 257/676 |
| 2009/0315159 A1 | 12/2009 | Abbott | |
| 2010/0044843 A1 | 2/2010 | Chien et al. | |
| 2010/0044850 A1 | 2/2010 | Lin et al. | |
| 2010/0258921 A1 | 10/2010 | Chien et al. | |
| 2010/0258934 A1 | 10/2010 | Chien et al. | |
| 2011/0163430 A1 | 7/2011 | Lee et al. | |

FOREIGN PATENT DOCUMENTS

| | | |
|---|---|---|
| CN | 2726111 | 9/2005 |
| CN | 1735963 | 2/2006 |
| CN | 1985371 | 6/2007 |
| CN | 101587868 | 11/2009 |
| JP | 05166985 | 7/1993 |
| JP | 11195733 | 7/1999 |
| JP | 2001024135 | 1/2001 |
| JP | 2005317998 | 11/2005 |

OTHER PUBLICATIONS

Chien, et al., U.S. Appl. No. 12/192,742, filed Aug. 15, 2008 for "Semiconductor Chip Package Having Ground and Power Regions and Manufacturing Methods Thereof." Office Action mailed Feb. 8, 2011.

Chien et al., U.S. Appl. No. 12/192,761, filed Aug. 15, 2008 for "Advanced Quad Flat No Lead Chip Package Having Marking and Corner Lead Features and Manufacturing Methods Thereof." Office Action mailed Apr. 7, 2011.

Chen et al., U.S. Appl. No. 12/192,805, filed Aug. 15, 2008 for "Advanced Quad Flat No Lead Chip Package Having a Protective Layer to Enhance Surface Mounting and Manufacturing Methods Thereof." Office Action mailed May 27, 2010; Notice of Allowance mailed Oct. 29, 2010; Office Action mailed Mar. 21, 2011.

Lin et al., U.S. Appl. No. 12/405,043, filed Mar. 16, 2009 for "Advanced Quad Flat Non-Leaded Package Structure and Manufacturing Method Thereof." Office Actions mailed Aug. 5, 2010, Jan. 7, 2011; Advisory Action mailed Mar. 22, 2011.

Chien, et al., U.S. Appl. No. 12/425,635, filed Apr. 17, 2009 for "Advanced Quad Flat Non-Leaded Package Structure and Manufacturing Method Thereof." Office Action mailed Feb. 18, 2011; Final Office Action Aug. 4, 2011.

Chien et al. U.S. Appl. No. 12/550,645, filed Aug. 31, 2009 for "Advanced Quad Flat Non-Leaded Package Structure and Manufacturing Method Thereof". Office Action mailed Apr. 6, 2011.

* cited by examiner

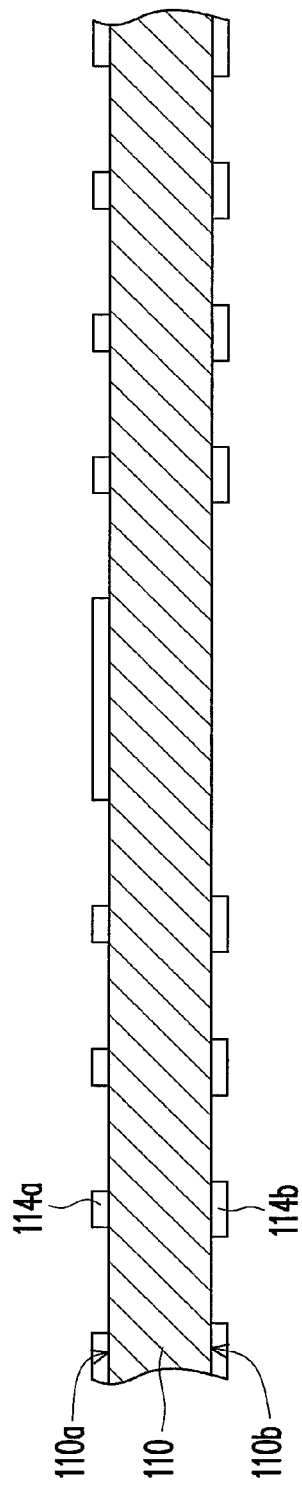
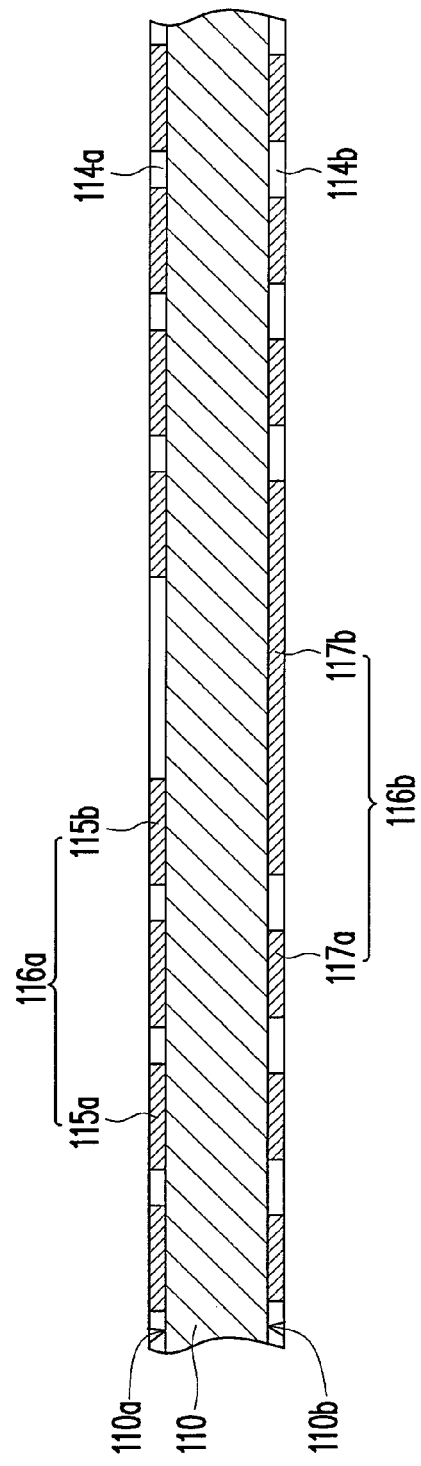

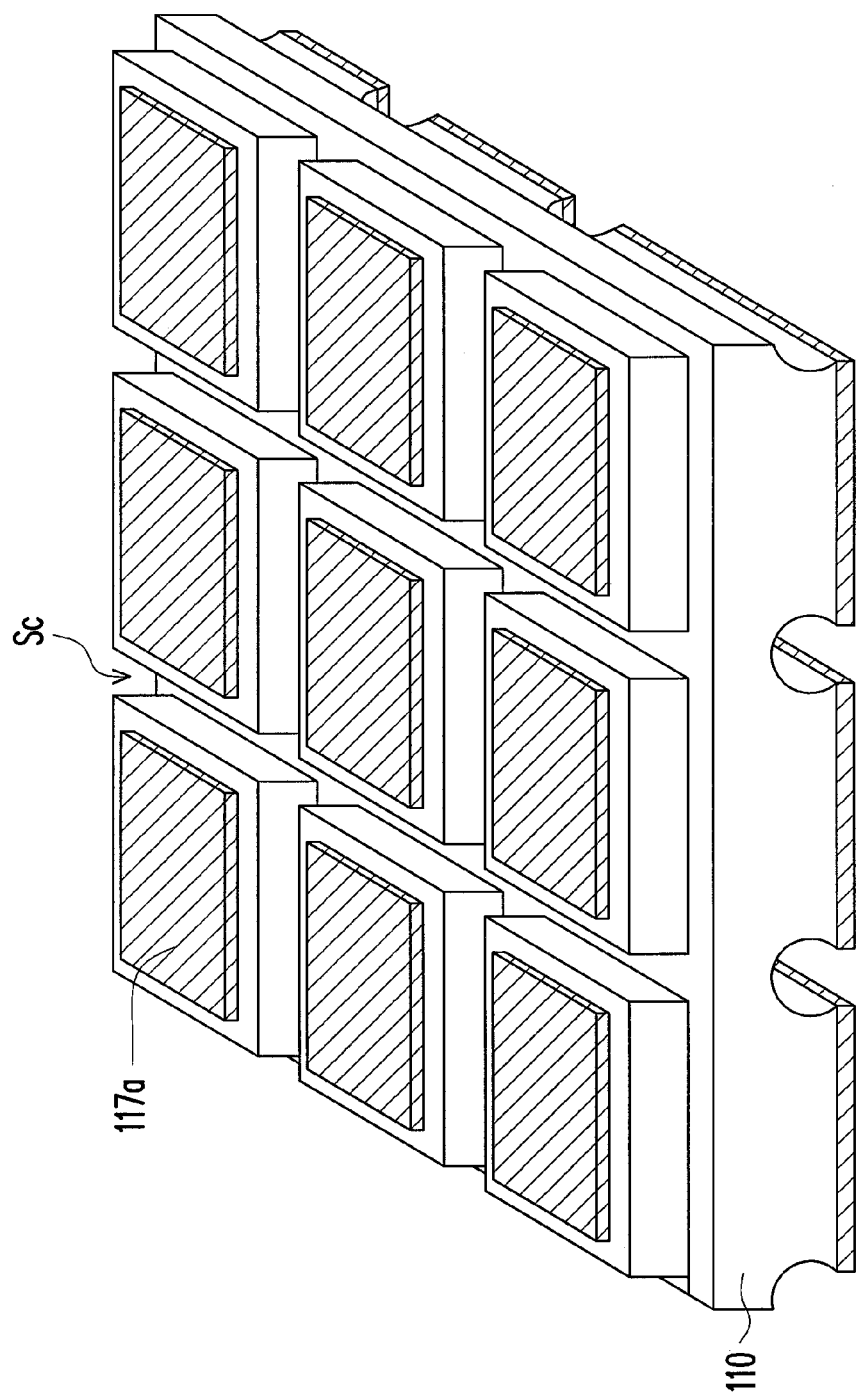
FIG. 1E"

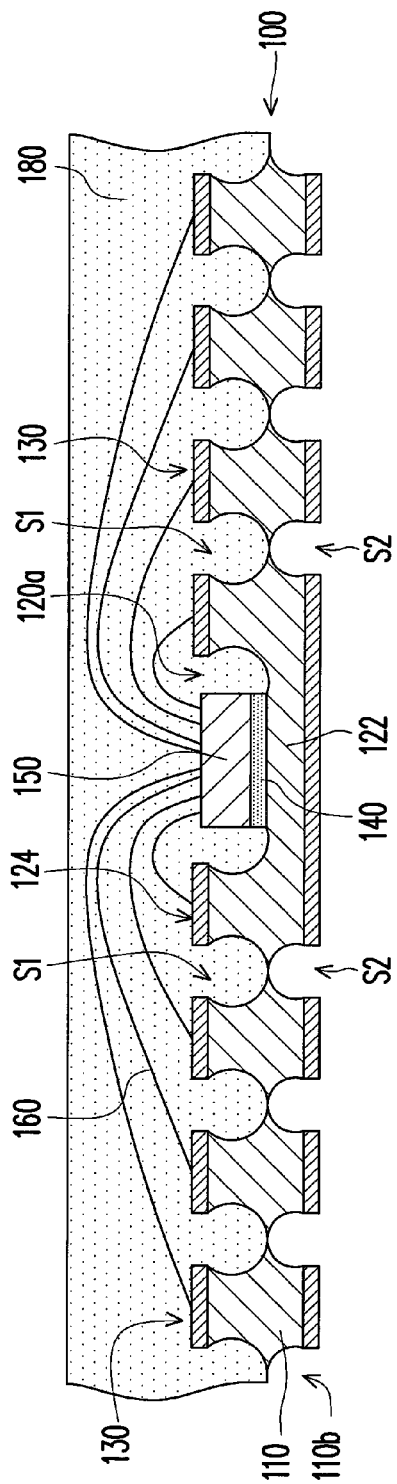
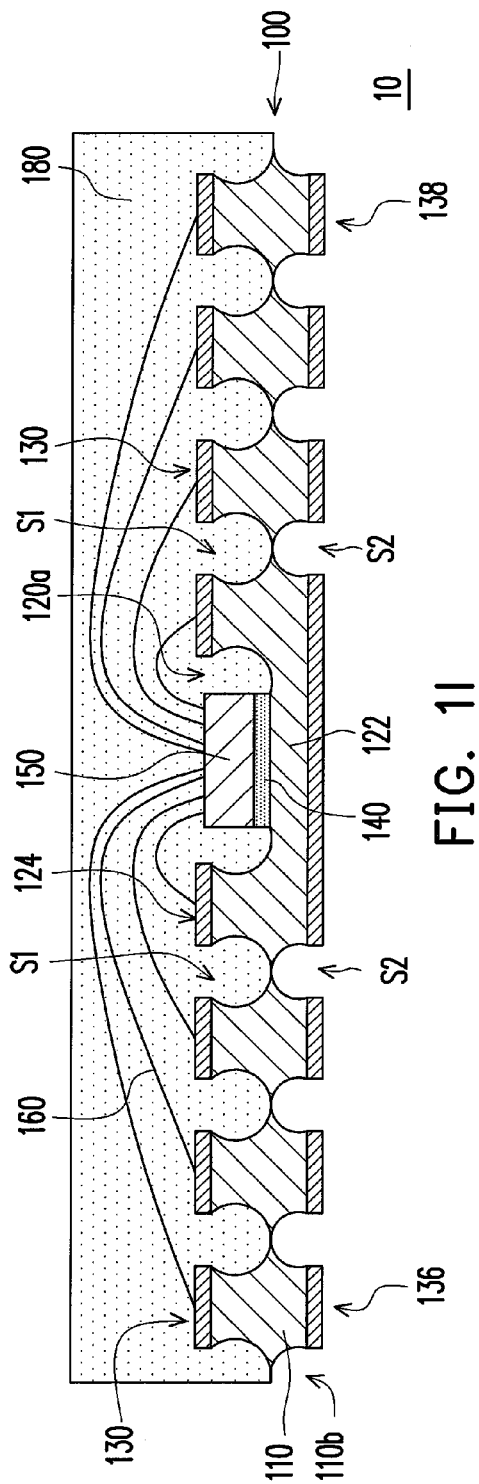
FIG. 1H
FIG. 1I

U.S. 8,124,447 B2

MANUFACTURING METHOD OF ADVANCED QUAD FLAT NON-LEADED PACKAGE

This application claims the priority benefit of U.S. Provisional Application Ser. No. 61/168,220, filed on Apr. 10, 2009. The entirety of the above-mentioned patent application is hereby incorporated by reference herein and made a part of this specification.

BACKGROUND OF THE INVENTION

1. Field of the Invention

The present invention generally relates to a package structure and a manufacturing method thereof. More particularly, the present invention relates to a manufacturing method of an advanced quad flat non-leaded (a-QFN) package structure.

2. Description of Related Art

Quad flat package (QFP) family includes I-type (QFI), J-type (QFJ) and non-lead-type (QFN) packages, characterized by the shape of the leads of leadframes. Among them, the QFN package structures offer a variety of advantages, including reduced lead inductance, small-sized footprint, thinner profile and faster speeds for signal transmission. Thus, the QFN package has become one popular choice for the package structures and is suitable for the chip package with high-frequency (for example, radio frequency bandwidth) transmission.

For the QFN package structure, the die pad and surrounding contact terminals (lead pads) are fabricated from a planar lead-frame substrate. The QFN package structure generally is soldered to the printed circuit board (PCB) through the surface mounting technology (SMT). Accordingly, the die pad or contact terminals/pads of the QFN package structure need to be designed to fit well within the packaging process capabilities, as well as promote good long term joint reliability.

SUMMARY OF THE INVENTION

The present invention is directed to a manufacturing method of an advanced quad flat non-leaded package, which can ensure complete isolation of lead contacts and enhance the product reliability.

The present invention provides a manufacturing method of an advanced quad flat non-leaded package structure. The substrate having an upper surface and a lower surface, a first metal layer and a second metal layer respectively formed on the upper surface and the lower surface of the substrate is provided, and the substrate includes at least an accommodating cavity and a plurality of inner leads. A pre-cutting process is performed to the lower surface of the substrate to form a plurality of pre-cut openings therein. Followed by providing a chip to the accommodating cavity of the substrate and forming a plurality of wires between the chip and the inner leads, a molding compound is formed over the substrate to encapsulate the chip, the wires, the inner leads, and filling the accommodating cavity and the openings of the substrate. Afterwards, a second etching process using the second metal layer as an etching mask is performed to etch through the pre-cut openings and the substrate, until the molding compound filled inside the first openings is exposed, so as to form a plurality of leads and a die pad.

According to embodiments of the present invention, the pre-cutting process can be performed after forming the molding compound.

According to embodiments of the present invention, the pre-cutting process can be a laser cutting process, a blade cutting process or an electric arc cutting process. Owning to the pre-cutting process, it is ensured that the second etching process can completely etch through the remained substrate to isolate and define the contact terminals (leads) and the die pad. Hence, taking advantage of the pre-cutting process, the process window of the second etching process can be widened and the residual issues can be minimized, which further improves the product reliability.

The present invention provides a manufacturing method of a lead frame. After providing a substrate having an upper surface and a lower surface, a first metal layer and a second metal layer having a plurality of openings are respectively formed on the upper and the lower surfaces of the substrate. An etching process is performed to the upper surface of the substrate, using the first metal layer as an etching mask, to form at least an accommodating cavity and a plurality of inner leads defined by first openings there-between. Later, a pre-cutting process is performed, through the openings, to the lower surface of the substrate to form a plurality of pre-cut openings.

The present invention provides a lead frame, comprising a substrate having an upper surface, a lower surface, a first metal layer on the upper surface of the substrate and a second metal layer having a plurality of openings on the lower surface of the substrate. The upper surface of the substrate includes at least an accommodating cavity and a plurality of first openings, and the lower surface of the substrate includes a plurality of pre-cut openings.

According to embodiments of the present invention, a bottom of the pre-cut opening is flat or U-shaped. The depth of the pre-cut opening ranges from about ⅕ to ⅖ of a thickness of the substrate. The width of the pre-cut opening ranges from about 50% to 100% of that of the opening.

In order to make the above and other features and advantages of the present invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A, 1B, 1C, 1D, 1E, 1F, 1G, 1H, and 1I are schematic cross-sectional views illustrating a manufacturing method of an advanced quad flat non-leaded (a-QFN) package structure according to an embodiment of the present invention.

FIGS. 1E' and 1E" respectively shows schematic, cross-sectional and three-dimensional views of an exemplary portion for the a-QFN package structure depicted in FIG. 1E.

DESCRIPTION OF THE EMBODIMENTS

Figure 1C:
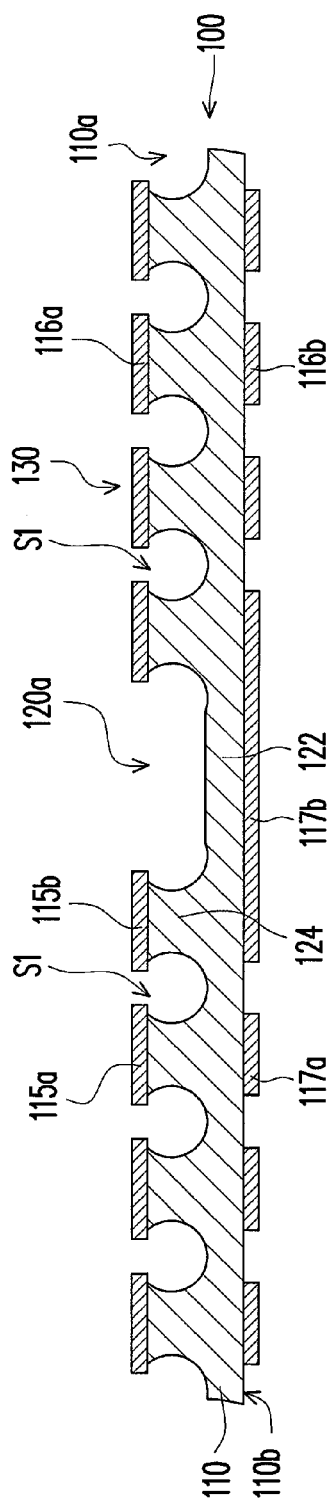

Reference will now be made in detail to the present preferred embodiments of the invention, examples of which are illustrated in the accompanying drawings. Wherever possible, the same reference numbers are used in the drawings and the descriptions to refer to the same or like parts.

FIGS. 1A through 1I are schematic cross-sectional views illustrating a manufacturing method of an advanced quad flat non-leaded package structure according to an embodiment of the present invention.

As shown in FIG. 1A, a substrate 110 having the upper surface 110a and the lower surface 110b is provided. The substrate 110 can be a metal carrier plate, for example. The material of the substrate 110 can be, for example, copper, a copper alloy, or other applicable metal materials. Next, still referring to the FIG. 1A, a first patterned photoresist layer 114a is formed on the upper surface 110a of the substrate 110, and a second patterned photoresist layer 114b is formed on the lower surface 110b of the substrate 110.

Next, referring to the FIG. 1B, using the first/second photoresist layers 114a/114b as masks, a first metal layer 116a is formed on the exposed portions of the upper surface 110a of the substrate 110 and a second metal layer 116b is formed on the exposed portions of the lower surface 110b of the substrate 110. In the present embodiment, the first metal layer 116a and the second metal layer 116b may be formed by, for example, plating. The first or second metal layer 116a/116b described herein may be composed of various groups of unconnected patterns or a continuous layer, depending on the pattern designs of the first or second patterned photoresist layer 114a/114b. The first metal layer 116a can be a Ni/Au layer, for example.

As shown in FIG. 1B, the first metal layer 116a includes a plurality of first metal portions 115a and at least a second metal portion 115b. The first metal portions 115a subsequently will be formed as inner leads 130 (as shown in FIG. 1D), while the second metal portion 115b will subsequently be formed as a ground ring 124 of the die pad 120 (as shown in FIG. 1H). Similarly, the second metal layer 116b includes a plurality of third metal portions 117a and at least a fourth metal portion 117b. The third metal portions 117a correspond to the subsequently to-be-formed inner leads 130, while the second metal portion 117b corresponds to the subsequently to-be-formed die pad 120.

Figure 1D:
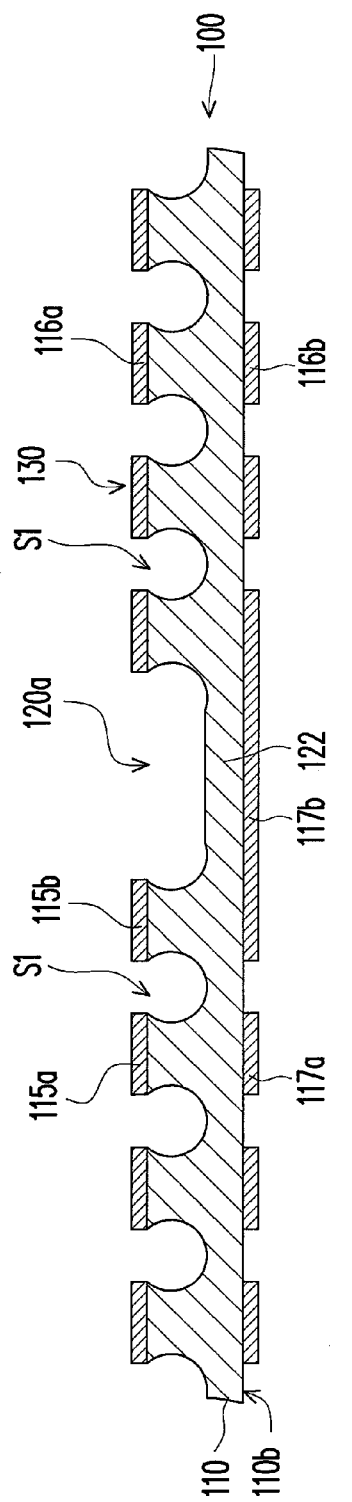

Next, referring to the FIG. 1C, the first photoresist layers 114a is removed. Then, a first etching process is performed to the upper surface 110a of the substrate 110 by using the first metal layer 116a as an etching mask, so as to remove portions of the substrate 110 and form at least an accommodating 120a and a plurality of first openings S1. The first etching process is a wet etching process, for example. As the first etching process is an isotropic etching process, undercuts can easily occur under the first metal layer 116a. Defined by the first openings S1, a plurality of individual inner leads 130 is formed. So far, the carrier 100 is roughly formed following the formation of the first metal layer 116a, the second metal layer 116b and patterning the substrate 110. The accommodating cavities 120a has a central portion 122 and a peripheral portion 124 disposed around the central portion 122. The inner leads 130 are disposed surrounding but separate from the peripheral portion 124. The inner leads 130 may be arranged in rows, columns or arrays. The peripheral portion 124 can function as the ground ring later.

Hence, as shown in FIG. 1D, a water-jet process is performed to cut off or remove portions of the first metal layer 116a right above the undercuts.

Figure 1E:
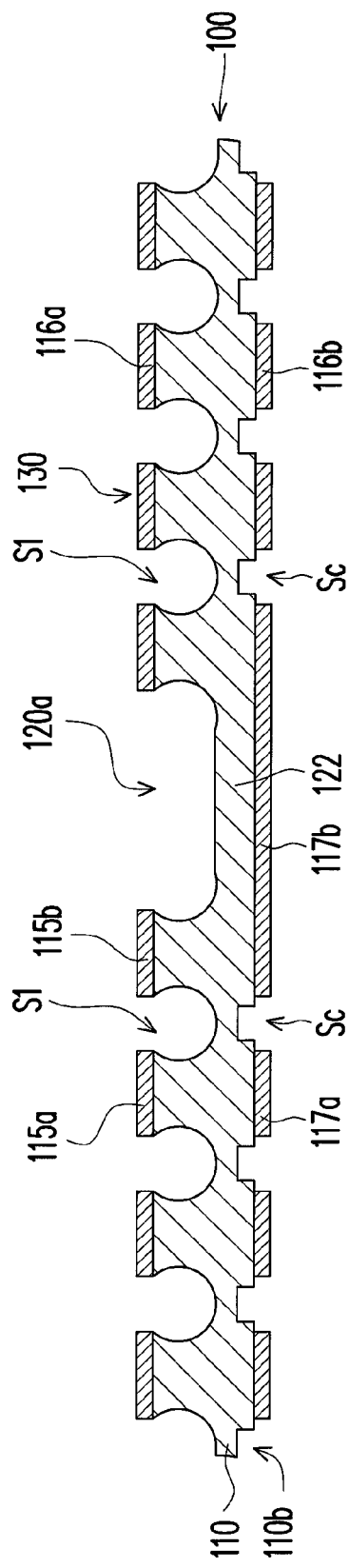
Figure 1E:
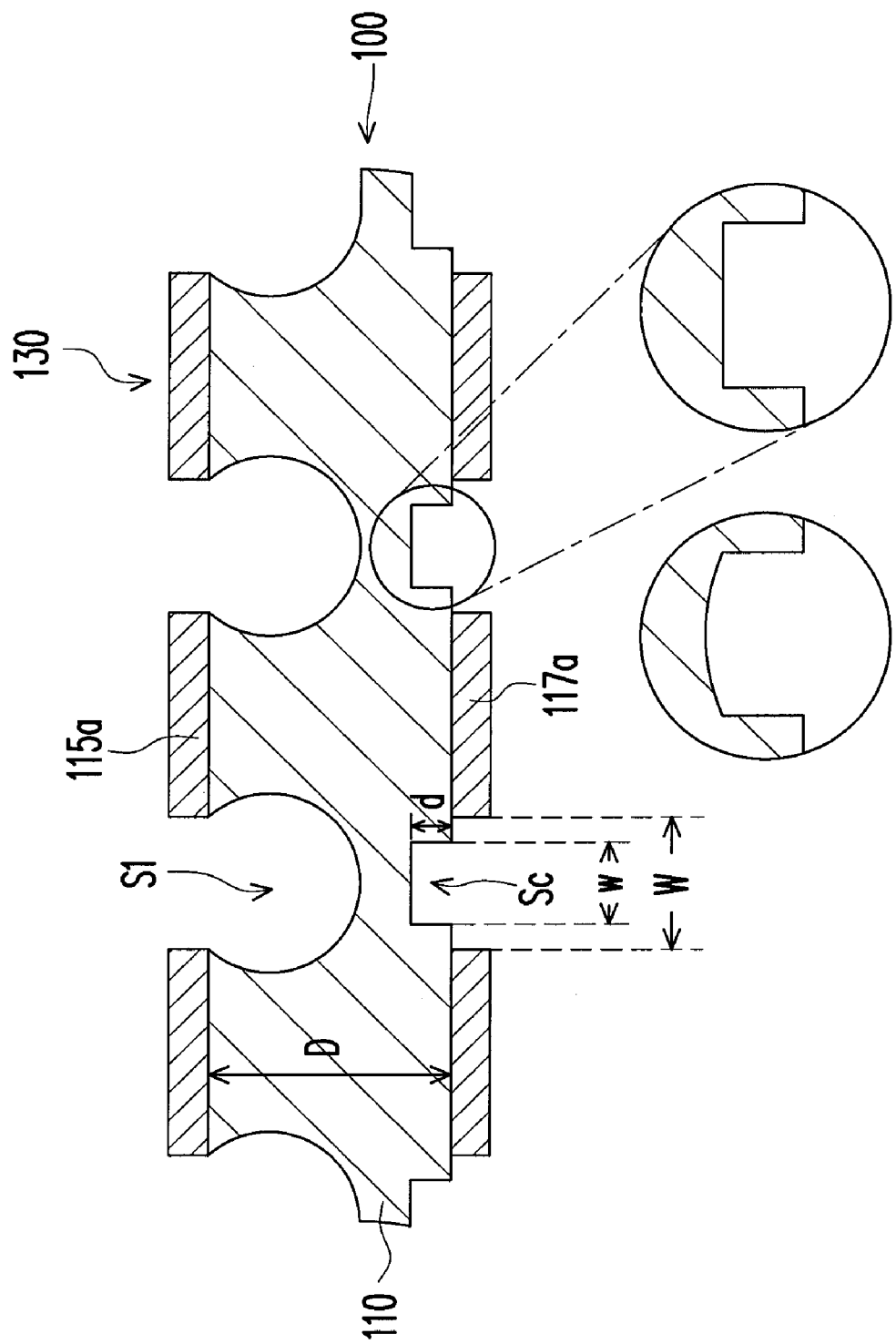

FIGS. 1E' and 1E" respectively shows an enlarged cross-sectional view and an enlarged 3D view (from the bottom side) of an exemplary portion for the a-QFN package structure shown in FIG. 1E. Afterwards, referring to the FIGS. 1E and 1E', a pre-cutting process is: performed to the lower surface 110b of the substrate 110 to form a plurality of pre-cut openings Sc in the substrate 110. The locations of the pre-cut openings Sc are arranged between the third metal portions 117a and the fourth metal portion 117b of the second metal layer 116b, and correspond to the first openings. The width w is smaller or about equivalent to (about 50% to 100% of) the distance W between the metal portions of the second metal layer 116b, for instance. For example, a depth d of the pre-cut opening Sc can be about 30-50 microns, a depth d of the pre-cut opening Sc is about 1/5 to 2/5 of the thickness D of the substrate 110. In details, as viewed from the bottom side of the substrate 110 in FIG. 1E", the pre-cut openings Sc may be shallow loop trenches surrounding or encircling the third metal portions 117a and the fourth metal portion 117b of the second metal layer 116b. The relative dimensions of the enlarged views may be amplified for illustration purposes and should not be interpreted as limitations for the scope of the present invention. The shape or the depth of the pre-cut openings can be adjusted according to processing parameters in the subsequent processes. The pre-cutting process can be a laser cutting process, a blade cutting process or an electric arc cutting process, for example. Depending on the pre-cutting process used, the shape of the bottom of the pre-cut openings Sc may be different. For example, for the pre-cut openings Sc formed by a blade cutting process, the bottom of the pre-cut openings Sc may be flat (FIG. 1E'). However, for the pre-cut openings Sc formed by a laser cutting process or an electric arc cutting process, the bottom of the pre-cut openings Sc may be U-shaped (FIG. 1E').

Figure 1F:
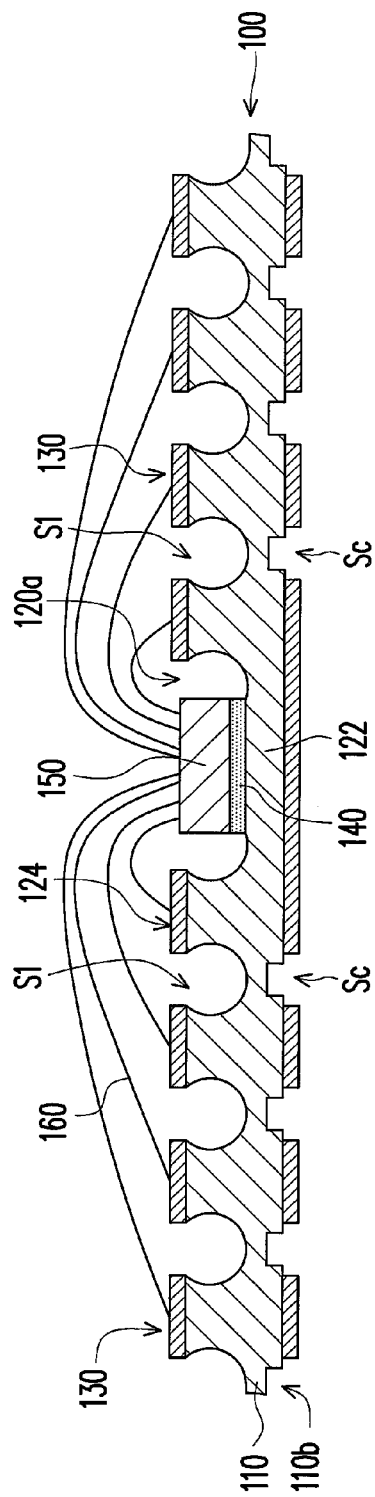

Next, referring to the FIG. 1F, at least a chip 150 is attached to the central portion 122 of each accommodating cavity 120a with an adhesive layer 140 in-between. Later, a plurality of wires 160 are provided between the chip 150, the ground ring 124 and the inner leads 130. In other words, the chip 150 is electrically connected to the ground ring 124 and the inner leads 130 through the wires 160.

Figure 1G:
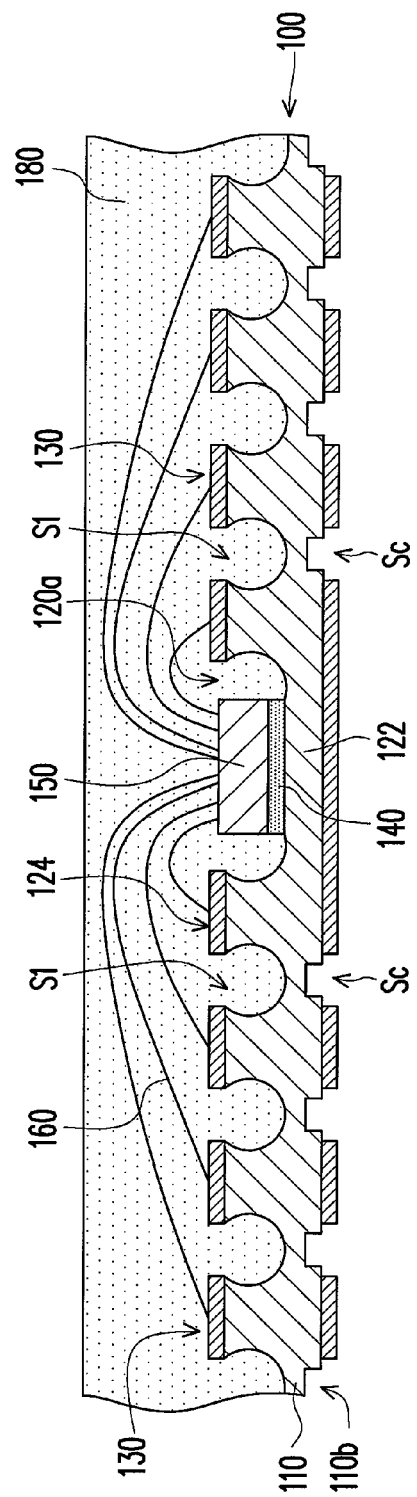

Next, referring to the FIG. 1G, a molding compound 180 is formed to encapsulate the chip 150, the wires 160, the inner leads 130, the ground ring 124, and fill the accommodating cavities 120a and the first openings S1. Alternatively, according to another embodiment, the pre-cutting process can be performed after forming the molding compound, rather than right after the first etching process.

Then, referring to the FIG. 1H, using the second metal layer 116b as an etching mask, a second etching process is performed toward the lower surface 110b of the carrier 100 to remove a portion of the substrate 110, so that the substrate 110 is etched through to expose the molding compound 180 filled inside the first openings S1 and simultaneously form a plurality of second openings S2. As the second metal layer 116b is used as the etching mask, the width of the second openings S2 is exactly the same as the distance W between the metal portions of the second metal layer 116b. The second etching process can be a wet etching process, for example. As the pre-cut openings Sc are located between the third metal portions 117a and the fourth metal portion 117b, the substrate 110 is in fact etched through the pre-cut openings Sc during the second etching process and is etched further deeper until being etched through. In this case, the second etching process enlarges the pre-cut openings Sc into the second openings S2. Owning to the formation of the second openings S2, a plurality of outer leads 136 is defined and the inner leads 130 are electrically isolated from one another. That is, after the second etching process, a plurality of leads or contact terminals 138, each consisting of one inner lead 130 and the corresponding outer lead 136, is formed. Besides, the second etching process further defines at least a die pad 120 of the carrier 100. The die pad 120 is surrounded by the leads 138 and isolated from the leads 138 through the second openings S2. On the whole, the leads 138 are electrically isolated from one another through this etching process. The depth ratio of the pre-cut openings Sc and the second openings S2 may range from about 3:8 to 1:2, for example.

If the substrate is not completely etched through during the second etching process, possible copper or metal residues remained from the incomplete removal might lead to contact shorts or other electrical problems. However, the pre-cutting process significantly helps mitigate the residual issues. Because the pre-cutting process is performed prior to the second etching process to cut into the substrate 110 to a pre-determined depth, the etching depth of the second etching process becomes smaller. That is, the depth of the second etching process to etch through the substrate 110 becomes shallower, due to the presence of the pre-cut openings Sc. In this way, it is ensured that the second etching process can completely remove the substrate 110 between the leads 138, so that the leads 138 are physically and electrically isolated from one another.

Afterwards, referring to FIG. 1I, a singulation process is performed, so that individual a-QFN package structures 10 are obtained.

In detail, in the present embodiment, the existence of the pre-cut openings Sc ensures the substrate 110 being etched through during the second etching process and the leads being electrically isolated after the second etching process. Consequently, the process window can be enlarged and the product reliability can be greatly improved. For the a-QFN package structure 10 in the present embodiment, the possible copper residual issues between the contact terminals (or leads) 138 can be lessened and the reliability of the package product can be enhanced.

Figure 2:
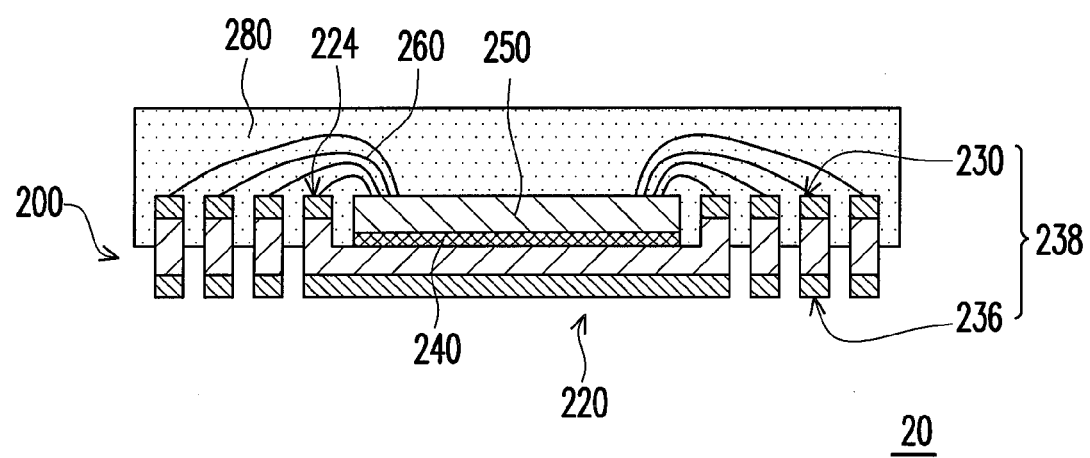
FIG. 2 shows a schematic cross-sectional view illustrating an advanced quad flat non-leaded (a-QFN) package structure according to an embodiment of the present invention.

FIG. 2 is a schematic cross-sectional view illustrating an advanced quad flat non-leaded (a-QFN) package structure according to an embodiment of the present invention, while one of the inner lead of the a-QFN package structure is shown in an enlarged 3D view on the right. Referring to FIG. 2, in the present embodiment, an advanced quad flat non-leaded (a-QFN) package structure 20 includes a carrier 200, a chip 250, a plurality of wires 260 and a molding compound 280.

The carrier 200 in the present embodiment is, for example, a leadframe. In detail, the carrier 200 includes a die pad 220 and a plurality of leads (contact terminals) 238. The leads 238 include a plurality of inner leads 230 and a plurality of outer leads 236. In FIG. 2, three columns/rows of the contact terminals 238 are schematically depicted. Specifically, the leads 238 are disposed around the die pad 220, and the material of the leads 238 may comprise nickel, gold or palladium, for example. The inner leads and the outer leads are defined by the molding compound; that is, the portions of the leads that are encapsulated by the molding compound are defined as the inner leads, while the outer leads are the exposed portions of the leads.

Further, the die pad 220 of the carrier 200 further includes at least a ground ring 224. The ground ring 224 is electrically connected to the chip 250 through wires 260. As the ground ring 224 is connected to the die pad 220, the die pad together with the ground ring may function as the ground plane. It should be noted that the position, the arrangement and the amount of the leads 238, relative to the ground ring 224 and the die pad 220 as shown in FIG. 2 are merely exemplificative and should not be construed as limitations to the present invention.

In addition, the molding compound 280 of the a-QFN package structure 20 in the present embodiment encapsulates the chip 250, the wires 260, the inner leads 230 and fills the gaps between the inner leads 230, while the outer leads 236 and the bottom surface of the die pad 220 are exposed. A material of the molding compound 280 is, for example, epoxy resins or other applicable polymer material.

For the a-QFN package structures according to the above embodiments, the outer leads are fabricated though one pre-cutting process and one etching process and the later etching process defines and isolates the outer leads. The a-QFN package structures in the present embodiments are designed to have better product reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a semiconductor package, comprising:

providing a metal carrier plate having an upper surface and a lower surface and a first metal layer on the upper surface of the metal carrier plate and a second metal layer on the lower surface of the metal carrier plate, wherein the upper surface of the metal carrier plate is patterned by a first etching process to form at least an accommodating cavity and a plurality of first openings using the first metal layer as a mask, and the lower surface of the metal carrier plate is patterned by a pre-cutting process to form a plurality of pre-cut openings;

providing a chip to the accommodating cavity of the metal carrier plate;

forming a plurality of wires between the chip and the first metal layer;

forming a package body over the metal carrier plate to encapsulate the chip, the wires, the first metal layer, and filling the accommodating cavity and the first openings; and performing a second etching process to the lower surface of the metal carrier plate using the second metal layer on the lower surface of the metal carrier plate as an etching mask to form a plurality of second openings by etching through the pre-cut openings and further etching through the metal carrier plate until the package body filled inside the first openings is exposed, so as to form a plurality of leads and a die pad.

2. The manufacturing method as claimed in claim 1, wherein the second etching process is an isotropic etching process and the first etching process is an isotropic etching process.

3. The manufacturing method as claimed in claim 2, further comprising performing a water-jet process to the upper surface of the metal carrier plate after the first etching process.

4. The manufacturing method as claimed in claim 1, wherein the pre-cutting process is a laser cutting process, a blade cutting process or an electric arc cutting process.

5. The manufacturing method as claimed in claim 1, wherein a bottom of at least one of the pre-cut openings is U shaped.

6. The manufacturing method as claimed in claim 1, wherein a depth of at least one of the pre-cut openings is in the range from $1/5$ to $2/5$ of a thickness of the metal carrier plate.

7. The manufacturing method as claimed in claim 1, wherein a width of at least one of the pre-cut openings is in the range from 50% to 100% of that of the second openings.

8. The manufacturing method as claimed in claim 1, wherein a width of at least one of the pre-cut openings is smaller than a width of each of the first openings.

9. The manufacturing method as claimed in claim 1, further comprising forming an adhesive layer within the accommodating cavity before the chip is provided.

10. A manufacturing method of a semiconductor package, comprising:
provide a metal carrier plate having an upper surface and a lower surface and a first metal layer on the upper surface of the metal carrier plate and a second metal layer on the lower surface of the metal carrier plate, wherein the upper surface of the metal carrier plate is patterned by a first etching process to form at least an accommodating cavity and a pluralit of first openings using the first metal layer as a mask, and the lower surface of the metal carrier plate is patterned by a pre-cutting process to form a plurality of pre-cut openings;
providing a chip to the accommodating cavity of the metal carrier plate;
forming a plurality of wires between the chip and the first metal layer;
forming a package body over the metal carrier plate to encapsulate the chip, the wires, the first metal layer, and filling the accommodating cavity and the first openings; and
performing a lead isolating process in areas of the plurality of pre-cut openings to form a plurality of second openings that expose the package body filled inside the first openings, so as to isolate a plurality of leads from one another.

11. The manufacturing method as claimed in claim 10, wherein the lead isolating process is an etching process.

12. The manufacturing method as claimed in claim 10, wherein a width of at least one of the pre-cut openings is smaller than a width of each of the first openings.

13. The manufacturing method as claimed in claim 10, wherein the pre-cutting process is a laser cutting process, a blade cutting process or an electric arc cutting process.

14. The manufacturing method as claimed in claim 10, wherein a bottom of at least one of the pre-cut openings is flat.

15. The manufacturing method as claimed in claim 10, wherein a depth of at least one of the pre-cut openings ranges from about ⅕ to ⅔ of a thickness of the metal carrier plate.

16. The manufacturing method as claimed in claim 10, wherein a width of at least one of the pre-cut openings ranges from about 50% to 100% of that of the second openings.

17. A manufacturing method of a semiconductor package, comprising:
providing a metal carrier plate having an upper surface and a lower surface and a first metal layer on the upper surface of the metal carrier plate and a second metal layer on the lower surface of the metal carrier plate, wherein the upper surface of the metal carrier plate is patterned by a first etching process to form at least an accommodating cavity and a plurality of first openings using the first metal layer as a mask;
providing a chip to the accommodating cavity of the metal carrier plate;
forming a plurality of wires between the chip and the first metal layer;
forming a package body over the metal carrier plate to encapsulate the chip, the wires, the first metal layer, and filling the accommodating cavity and the first openings;
performing a pre-cutting process to the lower surface of the metal carrier plate to form a plurality of pre-cut openings; and
performing a second etching process to the lower surface of the metal carrier plate using the second metal layer on the lower surface of the metal carrier plate as an etching mask to form a plurality of second openings by etching through the pre-cut openings and further etching through the metal carrier plate until the package body filled inside the first openings is exposed, so as to form a plurality of leads and a die pad.

18. The manufacturing method as claimed in claim 17, wherein the second etching process is an isotropic etching process and the first etching process is an isotropic etching process.

19. The manufacturing method as claimed in claim 18, further comprising performing a water-jet process to the upper surface of the metal carrier plate after the first etching process.

20. The manufacturing method as claimed in claim 17, wherein the pre-cutting process is a laser cutting process, a blade cutting process or an electric arc cutting process.

21. The manufacturing method as claimed in claim 17, wherein a bottom of at least one of the pre-cut openings is flat.

22. The manufacturing method as claimed in claim 17, wherein a depth of at least one of the pre-cut openings ranges from about ⅕ to ⅔ of a thickness of the metal carrier plate.

23. The manufacturing method as claimed in claim 17, wherein a width of at least one of the pre-cut openings ranges from about 50% to 100% of that of the second openings.

24. The manufacturing method as claimed in claim 17, wherein a width of at least one of the pre-cut openings is smaller than a width of each of the first openings.

25. The manufacturing method as claimed in claim 17, further comprising forming an adhesive layer within the accommodating cavity before the chip is provided.

26. A manufacturing method of a semiconductor package, comprising:
providing a metal carrier plate having an upper surface and a lower surface and a first metal layer on the upper surface of the metal carrier plate and a second metal layer on the lower surface of the metal carrier plate, wherein the upper surface of the metal carrier plate is patterned by a first etching process to form at least an accommodating cavity and a plurality of first openings using the first metal layer as a mask;
providing a chip to the accommodating cavity of the metal carrier plate;
forming a plurality of wires between the chip and the first metal layer;
forming a package body over the metal carrier plate to encapsulate the chip, the wires, the first metal layer, and filling the accommodating cavity and the first openings;
performing a pre-cutting process to the lower surface of the metal carrier plate to form a plurality of pre-cut openings; and
performing a lead isolating process in areas of the plurality of pre-cut openings to form a plurality of second openings that expose the package body filled inside the first openings, so as to isolate a plurality of leads from one another.

27. The manufacturing method as claimed in claim 26, wherein the lead isolating process is an etching process.

28. The manufacturing method as claimed in claim 26, wherein the pre-cutting process is a laser cutting process, a blade cutting process or an electric arc cutting process.

29. The manufacturing method as claimed in claim 26, wherein a width of at least one of the pre-cut openings is smaller than a width of each of the first openings.

* * * * *